(12) United States Patent
Lin et al.

(10) Patent No.: US 6,738,945 B2
(45) Date of Patent: May 18, 2004

(54) SIGNAL TRANSMISSION DEVICE AND METHOD FOR AVOIDING TRANSMISSION ERROR

(75) Inventors: Hung-Ming Lin, Hsinchu (TW); Hung-Ta Pai, Hsinchu (TW)

(73) Assignee: Silicon Integrated System Corp., Hsinchu (TW)

( * ) Notice: Subject to any disclaimer, the term of this patent is extended or adjusted under 35 U.S.C. 154(b) by 510 days.

(21) Appl. No.: 09/805,621

(22) Filed: Mar. 14, 2001

(65) Prior Publication Data

US 2002/0133777 A1 Sep. 19, 2002

(51) Int. Cl.$^7$ .......................... H03M 13/00; G06F 11/00
(52) U.S. Cl. .......................... 714/773; 714/746
(58) Field of Search .......................... 714/704, 781, 714/746, 773, 774

(56) References Cited

U.S. PATENT DOCUMENTS 5,062,111 A * 10/1991 Gotou et al. ................ 714/781
5,815,507 A * 9/1998 Vinggaard et al. .......... 714/704
6,128,358 A * 10/2000 Urata .......................... 375/366

* cited by examiner

*Primary Examiner*—Albert Decady
*Assistant Examiner*—Shelly A Chase
(74) *Attorney, Agent, or Firm*—Volpe and Koenig, P.C.

(57) ABSTRACT

A signal transmission device adapted to transmit an n-bit parallel digital signal is used for avoiding a transmission error. The device includes a detector for receiving a first and a second n-bit digital data consecutively occurred in the n-bit parallel digital signal, proceeding a first calculation to obtain a changed value, and outputting an indicating signal while the changed value is larger than a threshold, an encoder electrically connected to the detector for receiving the indicating signal and the second n-bit digital data, proceeding a second calculation, and outputting an encoded second n-bit digital data to reduce the changed value between the first n-bit digital data and the encoded second n-bit digital data below the threshold, and a decoder electrically connected to the detector and the encoder receiving the indicating signal and the encoded second n-bit digital data, proceeding a third calculation, and recovering the second n-bit digital data.

20 Claims, 6 Drawing Sheets

SIGNAL TRANSMISSION DEVICE AND METHOD FOR AVOIDING TRANSMISSION ERROR

FIELD OF THE INVENTION

The present invention relates to a signal transmission device and method for avoiding a transmission error, and more particularly to a signal transmission device and a method adapted to transmit an n-bit parallel digital signal for avoiding a transmission error.

BACKGROUND OF THE INVENTION

Among the integrated circuit (IC) chips, there are a larger number of data to be transmitted. Along with the increasing transmission speed, the characteristics of the transmission lines between chips critically affect the accuracy of the signal transmission. For a computer system, a central processing unit (CPU) 11 frequently accesses the digital data in a dynamic random access memory (DRAM) circuit 13 through a core logic circuit 12 as shown in FIG. 1. Hence, the binary voltage level signal is quickly transmitted in the transmission lines between the CPU 11 and the core logic circuit 12 and between the core logic circuit 12 and the DRAM circuit 13. However, because the equivalent capacitance value for the long transmission line is high, when the binary voltage level pulls up a data bit from "0" up to "1", a large amount of current Id is required as shown in FIG. 2A. On the contrary, when the binary voltage level signal pulls down a data bit from "1" to "0", similarly a large amount of current Is is required as shown in FIG. 2B. Therefore, when the data having many bits are transmitted by the parallel signal pattern at the same time between the core logic circuit 12 and the DRAM circuit 13, it is possible to occur that multiple bits simultaneously generate a level changed from "0" to "1" or from "1" to "0". The result will allow the output circuit to consume a lot of current to achieve the voltage level change. Thus, the whole system will be unstable or even result in a transmission error because the power-consumption is too big. For an 8-bit parallel digital signal, when two consecutive output data are "00000000" and "11111111", the output voltage V will be lower than the Vdd or even lower than the threshold of the level "1", which results in the transmission error, because the current Id as shown in FIG. 2A is too big. On the other hand, when two consecutive output data are "11111111" and "00000000", the output voltage V will be higher than ground (0) or even higher than the threshold of the level "0", which results in the transmission error, because the current Is as shown in FIG. 2B is also too big.

Therefore, the purpose of the present invention is to develop a device and a method to deal with the above situations encountered in the prior art.

SUMMARY OF THE INVENTION

It is therefore an object of the present invention to propose a signal transmission device adapted to transmit an n-bit parallel digital signal for avoiding a transmission error.

It is therefore another object of the present invention to propose a signal transmission device adapted to transmit an n-bit parallel digital signal for reducing power-consumption.

It is therefore an additional object of the present invention to propose a signal transmission device adapted to transmit an n-bit parallel digital signal for avoiding the system unstable.

According to the present invention, there is proposed a signal transmission device for avoiding a transmission error, adapted to transmit an n-bit parallel digital signal. The signal transmission device includes a detector, an encoder and a decoder. The detector is used for receiving a first n-bit digital data and a second n-bit digital data consecutively occurred in the n-bit parallel digital signal, proceeding a first calculation to obtain a changed value representative of a bit number having level change in an n-bit, and outputting an indicating signal while the changed value is larger than a threshold. The encoder electrically connected to the detector is used for receiving the indicating signal and the second n-bit digital data, proceeding a second calculation, and outputting an encoded second n-bit digital data to reduce the changed value between the first n-bit digital data and the encoded data of the second n-bit digital data below the threshold. The decoder electrically connected to the detector and the encoder is used for receiving the indicating signal and the encoded second n-bit digital data, proceeding a third calculation, and recovering the second n-bit digital data.

Preferably, the detector includes a delay circuit electrically connected to the encoder for delaying the first n-bit digital data outputted from the encoder in a preset time, and a Hamming distance detector electrically connected to the delay circuit for receiving the second n-bit digital data and the delayed first n-bit digital data, proceeding the first calculation to obtain a Hamming distance, and outputting the indicating signal while the Hamming distance is larger than the threshold.

Certainly, the threshold can be n/2.

Certainly, the encoder can be an exclusive-OR (XOR) operator for receiving the indicating signal and the second n-bit digital data, proceeding an exclusion operation, and outputting the encoded second n-bit digital data.

Certainly, the decoder can be an exclusive-OR (XOR) operator for receiving the indicating signal and the encoded second n-bit digital data, proceeding an exclusion operation, and recovering the second n-bit digital data.

Certainly, the encoder can be an exclusive-NOR (XNOR) operator for receiving the indicating signal and the second n-bit digital data, proceeding an exclusion-NOR operation, and outputting the encoded second n-bit digital data.

Certainly, the decoder is an exclusive-NOR (XNOR) operator for receiving the indicating signal and the encoded second n-bit digital data, proceeding an exclusion-NOR operation, and recovering the second n-bit digital data.

Preferably, the n-bit parallel digital signal is transmitted in a transmission line between two integrated circuit (IC) chips. Certainly, the two integrated circuit chips can be core logic circuit and dynamic random access memory (DRAM) circuit respectively or graphic accelerator circuit and dynamic random access memory (DRAM) circuit respectively.

According to the present invention, there is proposed a signal transmission method for avoiding a transmission error, adapted to transmit an n-bit parallel digital signal. The method includes steps of proceeding a first calculation of a first n-bit digital data and a second n-bit digital data consecutively occurred in the n-bit parallel digital signal to obtain a changed value representative of a bit number having level change in an n-bit, outputting an indicating signal while the changed value is larger than a threshold and proceeding a second calculation to obtain an encoded second n-bit digital data for reducing the changed value between the first n-bit digital data and the encoded second n-bit digital data below the threshold, and proceeding a third calculation of the encoded second n-bit digital data in response to the indicating signal to recover the second n-bit digital data.

Preferably, the changed value obtained by the first calculation is a Hamming distance. Preferably, the indicating signal is outputted while the changed value is larger than the threshold and the threshold is n/2.

Certainly, the second calculation can be an exclusive-OR operation of the indicating signal and the second n-bit digital data for outputting the encoded second n-bit digital data.

Certainly, the third calculation can be an exclusive-OR operation of the indicating signal and the encoded second n-bit digital data for recovering the second n-bit digital data.

Certainly, the second calculation can be an exclusive-NOR operation of the indicating signal and the second n-bit digital data for outputting the encoded second n-bit digital data.

Certainly, the third calculation can be an exclusive-NOR operation of the indicating signal and the encoded second n-bit digital data for recovering the second n-bit digital data.

According to the present invention, there is proposed a signal transmission device for avoiding a transmission error, adapted to transmit an n-bit parallel digital signal. The signal transmission device includes a detector, an encoder and a decoder. The detector is used for receiving a first n-bit digital data and a second n-bit digital data consecutively occurred in the n-bit parallel digital signal, proceeding a first calculation to obtain a changed value representative of a bit number having level change in an n-bit, and outputting an indicating signal while the changed value is larger than a threshold. The encoder electrically connected to the detector is used for proceeding a second calculation corresponding to the indicating signal and the second n-bit digital data and outputting an encoded second n-bit digital data to reduce the changed value between the first n-bit digital data and the encoded second n-bit digital data below the threshold. The decoder electrically connected to the detector and the encoder is used for proceeding a third calculation in response to the indicating signal and the encoded second n-bit digital data to recover the second n-bit digital data.

According to the present invention, there is proposed a signal transmission method for avoiding a transmission error, adapted to transmit an n-bit parallel digital signal. The method includes steps of proceeding a first calculation of a first n-bit digital data and a second n-bit digital data consecutively occurred in the n-bit parallel digital signal to obtain a changed value representative of a bit number having level change in an n-bit, proceeding a second calculation of the second n-bit digital data while the changed value is larger than a threshold and outputting an encoded second n-bit digital data for reducing the changed value between the first n-bit digital data and the encoded second n-bit digital data below the threshold, and proceeding a third calculation of the encoded second n-bit digital data to recover the second n-bit digital data.

The present invention may best be understood through the following description with reference to the accompanying drawings, in which:

DETAILED DESCRIPTION OF THE PREFERRED EMBODIMENTS

Figure 1:
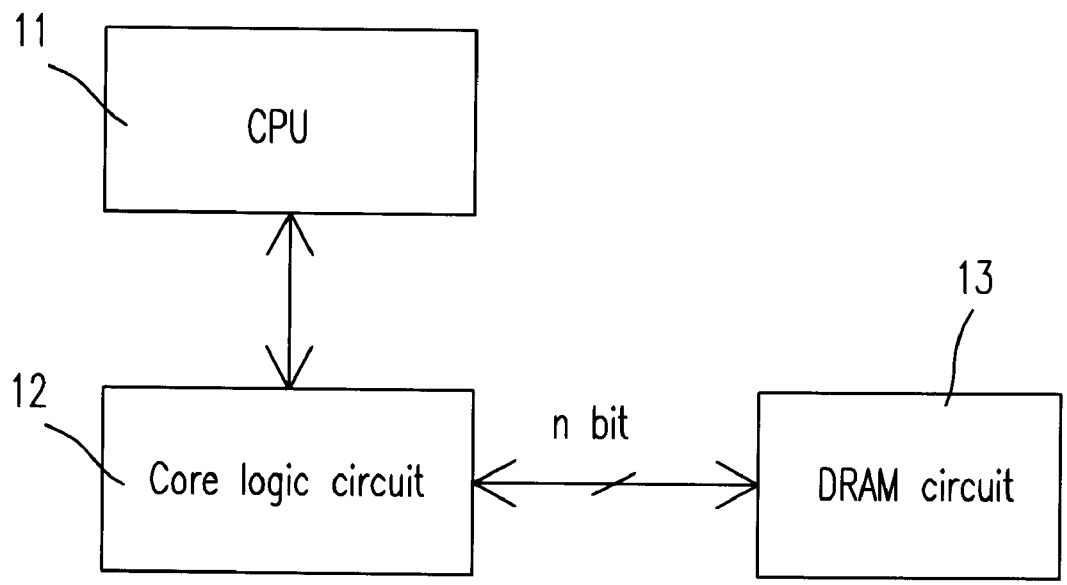
FIG. 1 is a block diagram illustrating a central processing unit (CPU) in a computer system accessing a digital data in a dynamic random access memory circuit (DRAM) via a core logic circuit according to the prior art.
Figure 2A:
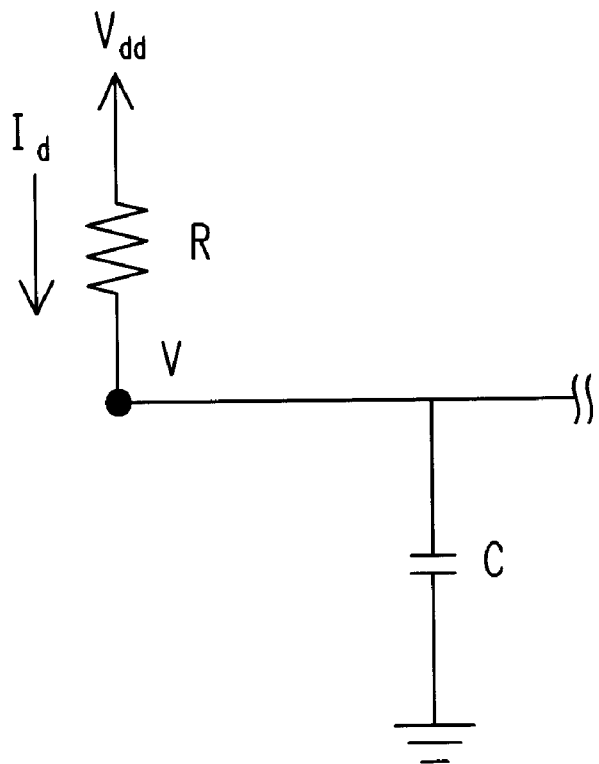
FIG. 2A is an equivalent circuit diagram illustrating a voltage of the high capacitance transmission line changed from high to low according to the prior art.
Figure 2B:
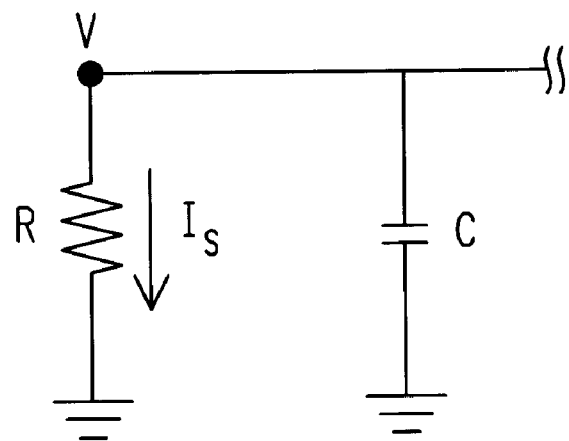
FIG. 2B is an equivalent circuit diagram illustrating a voltage of the high capacitance transmission line changed from low to high according to the prior art.
Figure 3:
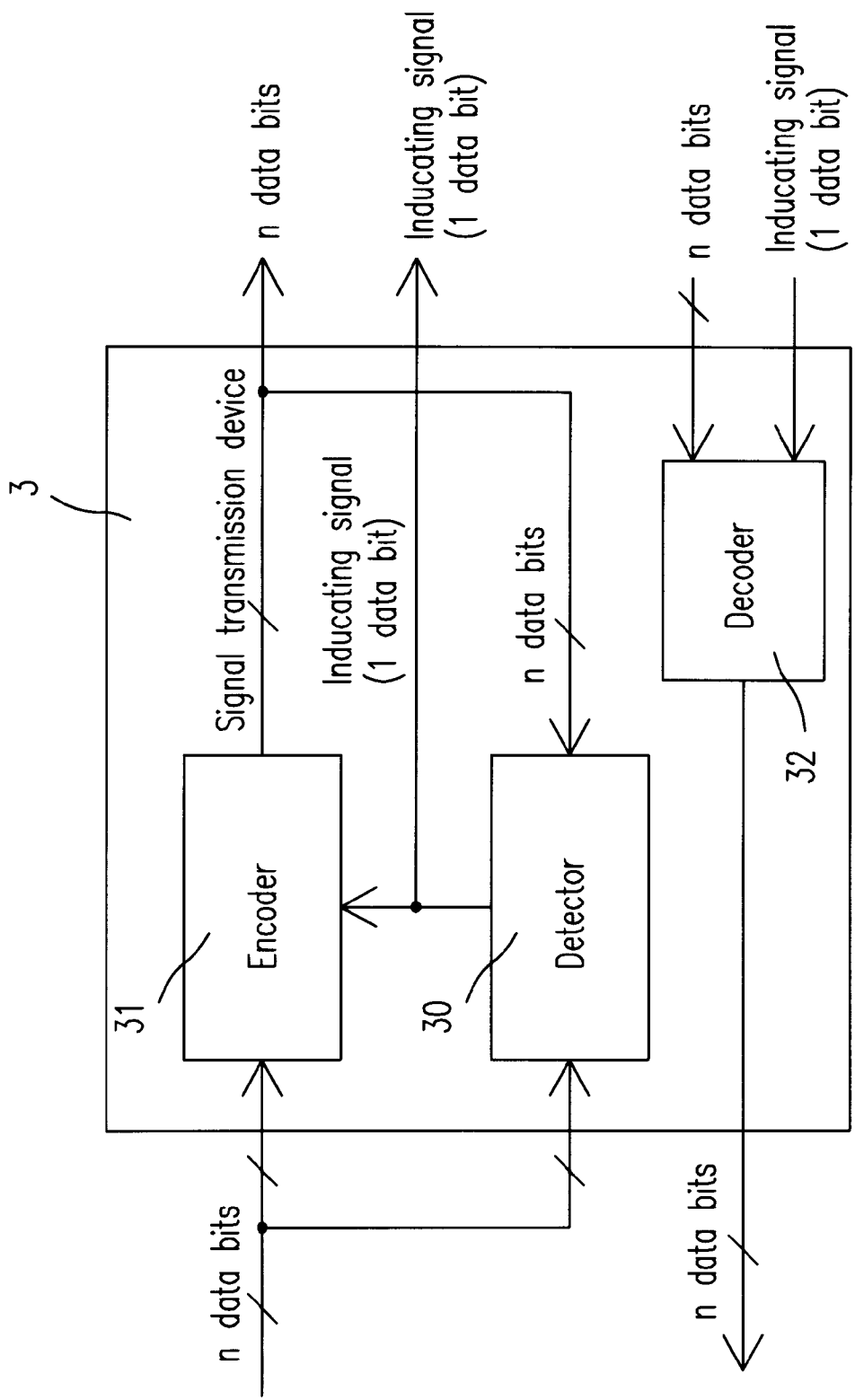
FIG. 3 is a block diagram illustrating a device for avoiding a transmission error according to a preferred embodiment of the present invention.

As shown in FIG. 3A, a signal transmission device 3 includes a detector 30, an encoder 31 and a decoder 32. The detector 30 is used for receiving a first and a second n-bit digital data consecutively occurred in an n-bit parallel digital signal, proceeding a first calculation to obtain a changed value to obtain a changed value, and outputting an indicating signal to the encoder 31 while the changed value is larger than a threshold. After receiving the indicating signal and the second n-bit digital data, the encoder 31 proceeds a second calculation and outputs an encoded second n-bit digital data to reduce the changed value between the first n-bit digital data and the encoded second n-bit digital data below the threshold. Sequentially, the decoder 32 is used for receiving the indicating signal and the encoded second n-bit digital data, proceeding a third calculation, and recovering the second n-bit digital data.

Figure 4A:
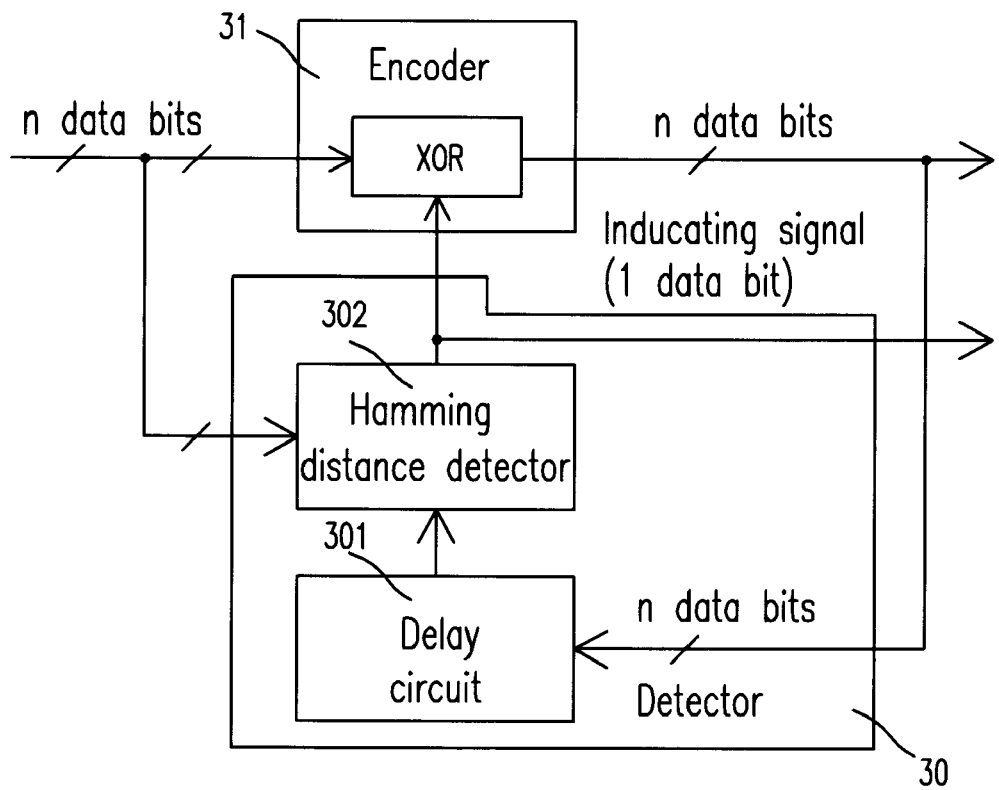
FIG. 4A is a block diagram illustrating a detector for a changed value and a first circuit of an encoder according to the present invention.

FIG. 4A is a block diagram illustrating a detector 30 for a changed value and a first circuit of an encoded 31 according to the present invention. As shown in FIG. 4A, the detector 30 includes a delayed circuit 301 and a Hamming distance detector 302. The delayed circuit 301 is used for outputting a first delayed n-bit digital data to the Hamming distance detector 302. The first delayed n-bit digital data is formed by delaying to output an n-bit digital data outputted by the encoder 31 in a preset time. After receiving the second n-bit digital data and the first delayed n-bit digital data, the Hamming distance detector 302 proceeds the first calculation to obtain a Hamming distance. The Hamming distance is used for defining the bit changed number of the bit sequence in the same length. For example, the Hamming distance of "00000000" and "11111111" is 8; the Hamming distance of "00001111" and "11110000" is 8; the Hamming distance of "00000000" and "10000001" is 2. The Hamming distance detector 302 outputs the indicating signal to the encoder 31 according to the obtained Hamming distance.

Figure 4B:
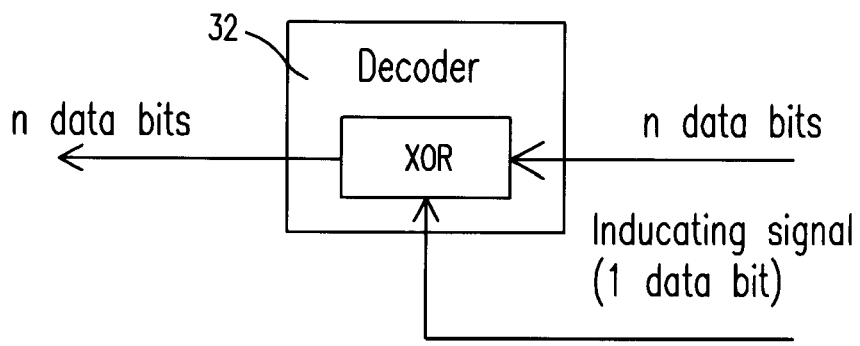
FIG. 4B is a block diagram illustrating a first circuit of a decoder according to the present invention.

The encoder 31 according to a preferred embodiment of the present invention is implemented by employing an exclusive operator. Generally, the threshold of the Hamming distance is set as n/2 for an n-bit digital data. For example, the first n-bit digital data is "00000000" and the second n-bit digital data is "11111100", so the Hamming distance of two above n-bit digital data is 6 and the threshold is 4. When the Hamming distance "6" is larger than the threshold "4", the Hamming distance detector 302 will output an indicating signal of logic "1" to the encoder 31. After receiving the indicating signal of logic "1" and the second n-bit digital data "11111100", the encoder 31 will proceed a second calculation such as an exclusive operation, to output an encoded second n-bit digital data such as "00000011". Hence, the Hamming distance of the first n-bit digital data "00000000" and the encoded second n-bit digital data "00000011" is 2, which is below the threshold 4. Therefore, the reduced Hamming distance can be transmitted in a high capacitance transmission line and will not result in transmission errors because of consuming too large current. As shown in FIG. 4B, the decoder 32 also employs an exclusive operator. After receiving the indicating signal and the encoded second n-bit digital data, the decoder 32 proceeds a third calculation such as an exclusive operation, to recover the second n-bit digital data.

Figure 5A:
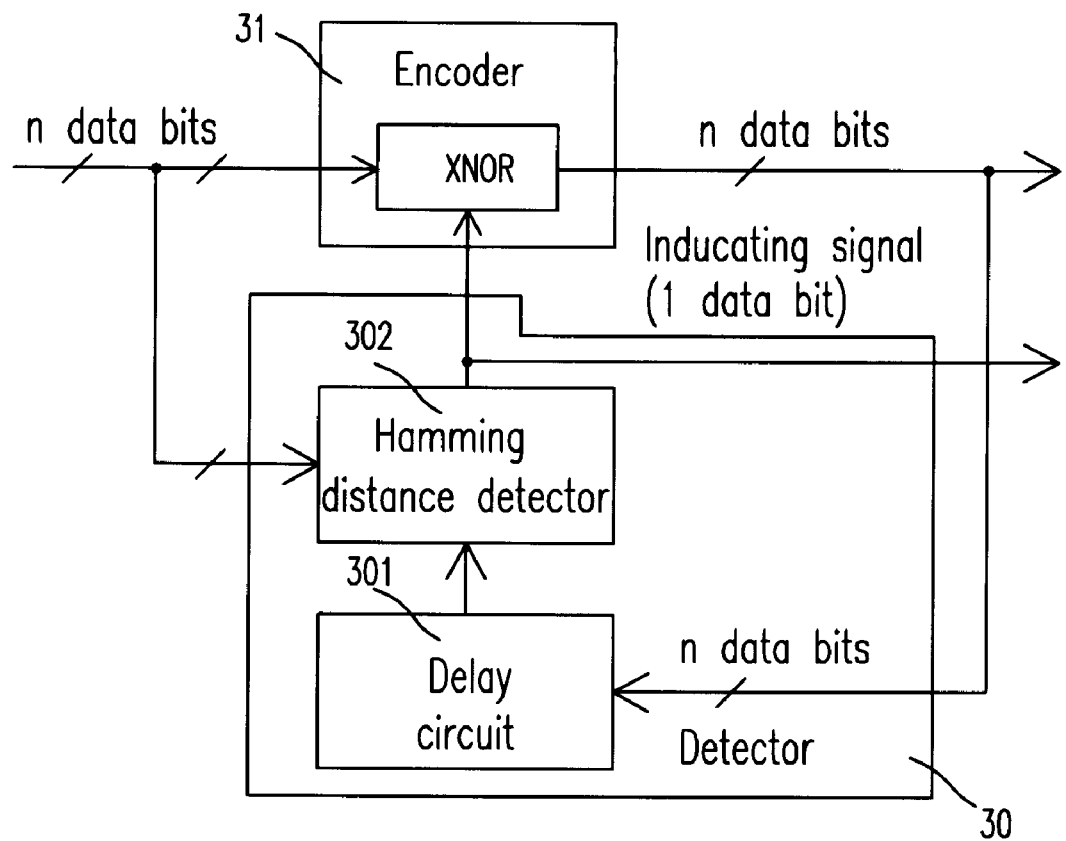
FIG. 5A is a block diagram illustrating a detector for a changed number and a second circuit of an encoder according to the present invention.
Figure 5B:
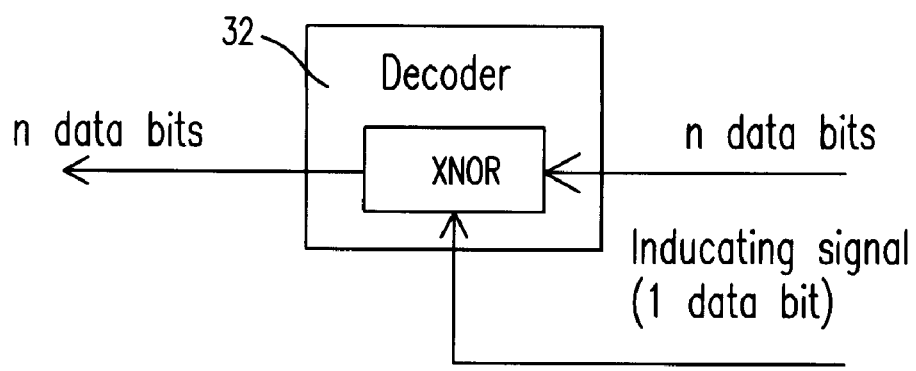
FIG. 5B is a block diagram illustrating a second circuit of a decoder according to the present invention.

FIGS. 5A–5B are block diagrams illustrating a detector 30, an encoder 31 and a second circuit of a decoder 32 according to the present invention. The difference between the first circuit shown in FIGS. 4A–4B and the second circuit shown in FIGS. 5A–5B is that the encoder 31 and the decoder 32 employ exclusive-NOR operators. Hence, when the Hamming distance of the first and the second n-bit digital data is larger than the threshold, the Hamming distance detector 302 will output an indicating signal of logic "0" instead of logic "1" to the encoder 31. Thus, the encoder 31 proceeds an exclusive-NOR operation of the indicating signal and the second n-bit digital data to obtain the encoded second n-bit digital data for further reducing the Hamming distance of the first n-bit digital data and the encoded second n-bit digital data below the threshold. Moreover, the operation principle of the remaining part in the second circuit is the same as that of the first circuit, which is not required to be mentioned repeatly.

Figure 6A:
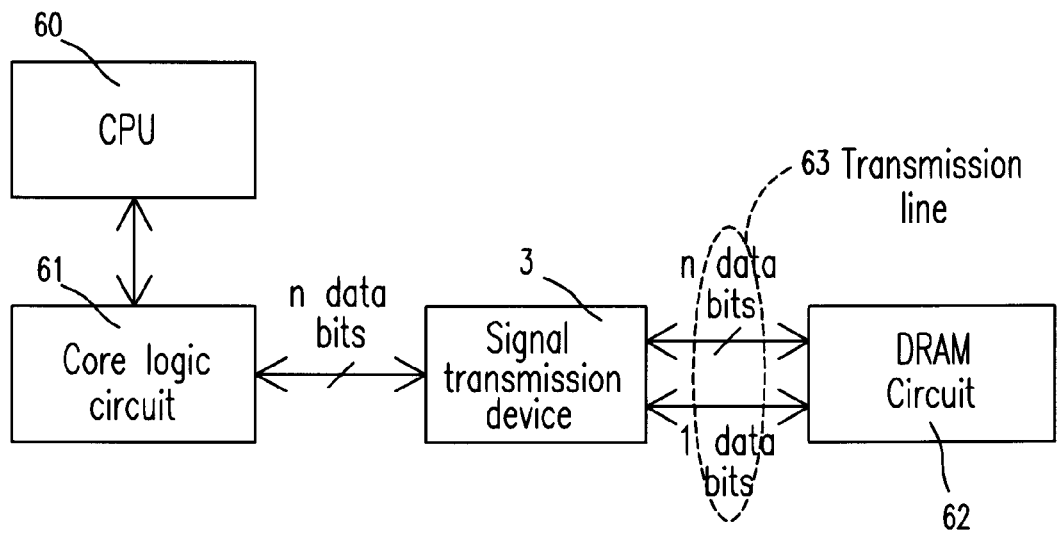
FIG. 6A is a block diagram illustrating the present invention applied in a central processing unit (CPU), a core logic circuit, and a dynamic random access memory (DRAM)
Figure 6B:
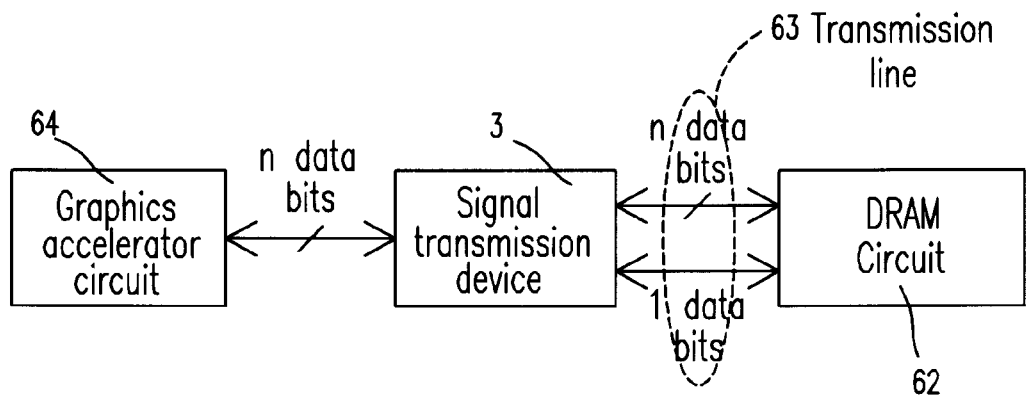
FIG. 6B is a block diagram illustrating the present invention applied in a graphic accelerator circuit and a dynamic random access memory (DRAM).

FIG. 6A is a block diagram illustrating the present invention applied in a central processing unit (CPU) 60, a core logic circuit 61, and a dynamic random access memory (DRAM) 62 for resolving the problem of having too big equivalent capacitance of a transmission line 63 between the core logic circuit 61 and the DRAM circuit 62. The signal transmission device according to the present invention is established between the core logic circuit 61 and the transmission line 63. Thus, the signal transmitted in the transmission line 63 is re-encoded for avoiding the transmission error. Furthermore, the additional accessed and transmitted one-bit signal is the indicating signal. FIG. 6B is a block diagram illustrating the present invention applied in a graphic accelerator circuit and a dynamic random access memory (DRAM). Also, the additional accessed and transmitted one-bit signal is the indicating signal.

In addition, the calculations proceeded by the above functional circuits can be achieved by software or programs.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A signal transmission device for transmitting an n-bit parallel digital signal and avoiding a transmission error, comprising:
    a detector for receiving a first n-bit digital data and a second n-bit digital data consecutively occurred in said n-bit parallel digital signal, proceeding a first calculation to obtain a changed value representative of a bit number having level change in an n-bit, and outputting an indicating signal while said changed value is larger than a threshold;
    an encoder electrically connected to said detector for receiving said indicating signal and said second n-bit digital data, proceeding a second calculation, and outputting an encoded second n-bit digital data to reduce said changed value between said first n-bit digital data and said encoded second n-bit digital data below said threshold; and
    a decoder electrically connected to said detector and said encoder for receiving said indicating signal and said encoded second n-bit digital data, proceeding a third calculation, and recovering said second n-bit digital data.

2. The device according to claim 1, wherein said detector comprises:
    a delay circuit electrically connected to said encoder for delaying said first n-bit digital data outputted from said encoder in a preset time; and
    a Hamming distance detector electrically connected to said delay circuit for receiving said second n-bit digital data and said delayed first n-bit digital data, proceeding said first calculation to obtain a Hamming distance, and outputting said indicating signal while said Hamming distance is larger than said threshold.

3. The device according to claim 2, wherein said threshold is n/2.

4. The device according to claim 1, wherein said encoder is an exclusive-OR (XOR) operator for receiving said indicating signal and said second n-bit digital data, proceeding an exclusion operation, and outputting said encoded second n-bit digital data.

5. The device according to claim 4, wherein said decoder is an exclusive-OR (XOR) operator for receiving said indicating signal and said encoded second n-bit digital data, proceeding an exclusion operation, and recovering said second n-bit digital data.

6. The device according to claim 1, wherein said encoder is an exclusive-NOR (XNOR) operator for receiving said indicating signal and said second n-bit digital data, proceeding an exclusion-NOR operation, and outputting said encoded second n-bit digital data.

7. The device according to claim 6, wherein said decoder is an exclusive-NOR (XNOR) operator for receiving said indicating signal and said encoded second n-bit digital data, proceeding an exclusion-NOR operation, and recovering said second n-bit digital data.

8. The device according to claim 1, wherein said n-bit parallel digital signal is transmitted in a transmission line between two integrated circuit (IC) chips.

9. The device according to claim 8, wherein said two integrated circuit chips are core logic circuit and dynamic random access memory (DRAM) circuit respectively.

10. The device according to claim 8, wherein said two integrated circuit chips are graphic accelerator circuit and dynamic random access memory (DRAM) circuit respectively.

11. A signal transmission method for transmitting an n-bit parallel digital signal and avoiding a transmission error, comprising steps of:
    proceeding a first calculation of a first n-bit digital data and a second n-bit digital data consecutively occurred in said n-bit parallel digital signal to obtain a changed value representative of a bit number having level change in an n-bit;
    outputting an indicating signal while said changed value is larger than a threshold and proceeding a second calculation to obtain an encoded second n-bit digital data for reducing said changed value between said first n-bit digital data and said encoded second n-bit digital data below said threshold; and
    proceeding a third calculation of said encoded second n-bit digital data in response to said indicating signal to recover said second n-bit digital data.

12. The method according to claim 11, wherein said changed value obtained by said first calculation is a Hamming distance.

13. The method according to claim 12, wherein said indicating signal is outputted while said changed value is larger than said threshold.

14. The method according to claim 13, wherein said threshold is n/2.

15. The method according to claim 11, wherein said second calculation is an exclusive operation of said indicating signal and said second n-bit digital data for outputting said encoded second n-bit digital data.

16. The method according to claim 15, wherein said third calculation is an exclusive operation of said indicating signal and said encoded second n-bit digital data for recovering said second n-bit digital data.

17. The method according to claim 11, wherein said second calculation is an exclusive-NOR operation of said indicating signal and said second n-bit digital data for outputting said encoded second n-bit digital data.

18. The method according to claim 17, wherein said third calculation is an exclusive-NOR operation of said indicating signal and said encoded second n-bit digital data for recovering said second n-bit digital data.

19. A signal transmission device for transmitting an n-bit parallel digital signal and avoiding a transmission error, comprising:

a detector for receiving a first n-bit digital data and a second n-bit digital data consecutively occurred in said n-bit parallel digital signal, proceeding a first calculation to obtain a changed value representative of a bit number having level change in an n-bit, and outputting an indicating signal while said changed value is larger than a threshold;

an encoder electrically connected to said detector for proceeding a second calculation corresponding to said indicating signal and said second n-bit digital data and outputting an encoded second n-bit digital data to reduce said changed value between said first n-bit digital data and said encoded second n-bit digital data below said threshold; and a decoder electrically connected to said detector and said encoder for proceeding a third calculation in response to said indicating signal and said encoded second n-bit digital data to recover said second n-bit digital data.

20. A signal transmission method for transmitting an n-bit parallel digital signal and avoiding a transmission error, comprising steps of:

proceeding a first calculation of a first n-bit digital data and a second n-bit digital data consecutively occurred in said n-bit parallel digital signal to obtain a changed value representative of a bit number having level change in an n-bit;

proceeding a second calculation of said second n-bit digital data while said changed value is larger than a threshold and outputting an encoded second n-bit digital data for reducing said changed value between said first n-bit digital data and said encoded second n-bit digital data below said threshold; and proceeding a third calculation of said encoded second n-bit digital data to recover said second n-bit digital data.

* * * * *